United States Patent
Nakamura et al.

(10) Patent No.: US 10,615,070 B2
(45) Date of Patent: Apr. 7, 2020

(54) BASE FILM FOR SHEETS FOR SEMICONDUCTOR WAFER PROCESSING, SHEET FOR SEMICONDUCTOR WAFER PROCESSING, AND METHOD OF MANUFACTURING SEMICONDUCTOR DEVICES

(71) Applicant: LINTEC CORPORATION, Tokyo (JP)

(72) Inventors: Masatomo Nakamura, Tokyo (JP); Shigeyuki Yamashita, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 374 days.

(21) Appl. No.: 15/514,842

(22) PCT Filed: Sep. 28, 2015

(86) PCT No.: PCT/JP2015/077397
§ 371 (c)(1),
(2) Date: Mar. 28, 2017

(87) PCT Pub. No.: WO2016/052444
PCT Pub. Date: Apr. 7, 2016

(65) Prior Publication Data
US 2017/0213757 A1 Jul. 27, 2017

(30) Foreign Application Priority Data

Sep. 29, 2014 (JP) .................................. 2014-199400

(51) Int. Cl.
*H01L 21/00* (2006.01)
*H01L 21/683* (2006.01)
(Continued)

(52) U.S. Cl.
CPC .......... *H01L 21/6836* (2013.01); *B23K 26/53* (2015.10); *C09J 7/29* (2018.01);
(Continued)

(58) Field of Classification Search
CPC ... H01L 23/29; H01L 21/6715; H01L 21/324; H01L 21/302; H01L 21/6836; B23K 26/53; C09J 7/29
See application file for complete search history.

(56) References Cited

U.S. PATENT DOCUMENTS

2006/0005911 A1* 1/2006 Kubo ................ H01L 21/67132
156/84
2012/0070658 A1 3/2012 Ikishima et al.

FOREIGN PATENT DOCUMENTS

JP 2002-226803 A 8/2002
JP 2005-109043 A 4/2005
(Continued)

OTHER PUBLICATIONS

International Search Report of the International Searching Authority dated Dec. 15, 2015 for the corresponding International application No. PCT/JP2015/077397 (and English translation).
(Continued)

*Primary Examiner* — Richard A Booth
(74) *Attorney, Agent, or Firm* — Posz Law Group, PLC

(57) ABSTRACT

A base film for sheets for semiconductor wafer processing, comprising a resin layer (A) and a resin layer (B) laminated on one surface of the resin layer (A), wherein one surface of the base film for sheets for semiconductor wafer processing comprises a surface of the resin layer (B), the resin layer (A) contains a thermoplastic elastomer having a Vicat softening point of 50° C. or higher and 87° C. or lower, the resin layer (B) contains a thermoplastic elastomer having a Vicat softening point of 91° C. or higher and 220° C. or lower, and a
(Continued)

thickness t of the base film for sheets for semiconductor wafer processing and a thickness $t_A$ of the resin layer (A) satisfy the Formulae (1) t≤150 μm and (2) $t_A/t$≥78%.

11 Claims, 1 Drawing Sheet

(51) Int. Cl.
    *C09J 7/29* (2018.01)
    *B23K 26/53* (2014.01)
    *H01L 21/302* (2006.01)
    *H01L 21/324* (2006.01)
    *H01L 21/67* (2006.01)
    *H01L 23/29* (2006.01)
    *H01L 23/31* (2006.01)

(52) U.S. Cl.
    CPC .......... *H01L 21/302* (2013.01); *H01L 21/324* (2013.01); *H01L 21/6715* (2013.01); *H01L 23/29* (2013.01); *H01L 23/31* (2013.01); *C09J 2201/122* (2013.01); *C09J 2201/162* (2013.01); *C09J 2201/606* (2013.01); *C09J 2201/622* (2013.01); *C09J 2203/326* (2013.01); *H01L 2221/68327* (2013.01)

(56) References Cited

FOREIGN PATENT DOCUMENTS

| JP | 2005-229040 A | 8/2005 |
|----|---------------|--------|
| JP | 2006-164883 A | 6/2006 |
| JP | 2009-231700 A | 10/2009 |
| JP | 2011-139042 A | 7/2011 |
| JP | 2012-062405 A | 3/2012 |
| JP | 2013-157228 A | 8/2013 |
| JP | 2014-165462 A | 9/2014 |

OTHER PUBLICATIONS

Information Statement Submitted to the JPO by third party dated Oct. 25, 2019 for the corresponding JP application No. 2016-552028 (and English translation).

Notification from the JPO dated Nov. 5, 2019 for the corresponding JP application No. 2016-552028 (and English translation).

Request for Inspection of a File Wrapper filed to JPO dated Nov. 20, 2019 for the corresponding JP application No. 2016-552028 (and English translation).

\* cited by examiner

BASE FILM FOR SHEETS FOR SEMICONDUCTOR WAFER PROCESSING, SHEET FOR SEMICONDUCTOR WAFER PROCESSING, AND METHOD OF MANUFACTURING SEMICONDUCTOR DEVICES

CROSS REFERENCE TO RELATED APPLICATIONS

This application is a U.S. national stage application of PCT/JP2015/077397 filed on Sep. 28, 2015, which claims priority to Japanese patent application No. 2014-199400 filed on Sep. 29, 2014, the contents of which are incorporated herein by reference.

TECHNICAL FIELD

The present invention relates to a base film for sheets for semiconductor wafer processing, a sheet for semiconductor wafer processing, and a method of manufacturing semiconductor devices.

BACKGROUND ART

When chip-like semiconductor devices are manufactured from a workpiece such as a semiconductor wafer, a blade dicing process has conventionally been performed in general to obtain chips by cutting the workpiece using a rotating blade while spraying the workpiece with a liquid for washing, etc. In recent years, however, a process of stealth dicing (registered trademark) is being adopted, which is a dry process that is capable of division into chips. In the process of stealth dicing (registered trademark), workpiece is irradiated with laser light having a large numerical aperture (NA) so that modified layers are formed preliminarily in the workpiece, while minimizing the damage which the workpiece receives in the vicinity of the surface, and thereafter in an expanding step or the like, chips are obtained by applying force to the workpiece.

As a specific example, the expanding step is performed in a manner as below. A sheet for semiconductor wafer processing is put into a state in which a workpiece that has been irradiated with laser light to form modified layers therein (also referred to as a "modified workpiece" in the present description) is attached to the sheet and a ring frame is attached to the circumference of the modified workpiece. A ring-like member is caused to come into contact with a region of the sheet for semiconductor wafer processing that is located between the region to which the modified workpiece is attached and the region to which the ring frame is attached, and the relative positions of the ring-like member and the ring frame in the vertical direction are varied. This varying the relative positions allows the dicing sheet to be applied with the tensile force. Varying the relative positions in the vertical direction as the above is ordinarily performed by pulling down the ring frame with respect to the ring-like member.

When a tensile force is applied to the sheet for semiconductor wafer processing in the expanding step as the above, loosening may occur in the sheet for semiconductor wafer processing to an extent that affects the subsequent steps. Specifically, if the loosening amount due to applying a tensile force to the sheet for semiconductor wafer processing (the displacement distance in the vertical direction of the bottom surface of the sheet for semiconductor wafer processing with reference to the lower side surface of a portion of the sheet for semiconductor wafer processing which is attached to the ring frame) is unduly large, the loosened bottom surface of the sheet for semiconductor wafer processing or the vicinity thereof will readily collide with foreign materials during transport, thus leading to poor handling ability when using the sheet for semiconductor wafer processing. Therefore, when the loosening amount of the sheet for semiconductor wafer processing is large, the sheet for semiconductor wafer processing may be partially heated to allow for the thermal shrinkage of a base film for sheets for semiconductor wafer processing, which is possessed by the sheet for semiconductor wafer processing, so that the loosening amount of the sheet for semiconductor wafer processing can be reduced. In the present description, the phenomenon that the loosening amount of the sheet for semiconductor wafer processing is reduced on the basis of the thermal shrinkage of the above base film may also be referred to as "recovery," and a base film for sheets for semiconductor wafer processing capable of providing a sheet for semiconductor wafer processing that has at least one of the property of allowing for easy recovery and the property of having a large recovery amount (reduction amount of the loosening amount) may also be referred to as a "base film for sheets for semiconductor wafer processing that has recoverability."

Patent Literature 1 discloses using a base film for sheets for semiconductor wafer processing that comprises a thermoplastic crosslinked resin having a thermal conductivity of 0.15 W/m·K or more, as a base film for sheets for semiconductor wafer processing that is excellent in the recoverability.

PRIOR ART LITERATURE

Patent Literature

[Patent Literature 1] JP2005-229040A

SUMMARY OF THE INVENTION

Problems to be Solved by the Invention

In recent years, there are needs to stack another chip on a chip manufactured in the above manner and to bond a chip onto a film substrate. In some technical fields, face-up mounting is shifted to flip-chip bonding or TSV (Through Silicon Via) technique. In the face-up mounting, the circuit of a chip is connected to the circuit on another chip or on a substrate using wires. In the flip-chip bonding, projection-type electrodes are provided on an electrode formation surface of a chip and the electrode formation surface is caused to face the circuit on another chip or on a substrate to directly connect them using the electrodes. In response to the demands of stacking/adhesion of chips in such flip-chip bonding or the like, there is proposed a method of fixing a chip provided with electrodes to another chip or a film substrate using an adhesive.

One proposed scheme for easy application to such uses includes, in a process of the above manufacturing method, attaching a dicing sheet to the opposite surface to the electrode formation surface of a workpiece having electrodes or modified workpiece having electrodes, laminating a film-like adhesive on the electrode formation surface, and performing the expanding step to divide the workpiece or modified workpiece into chips having electrodes so that each of the divided chips is provided with an adhesive layer on the electrode formation surface. The film-like adhesive used in this scheme to give the adhesive layers may be an anisotropically-conductive film or nonconductive one. The nonconductive one is also referred to as a "nonconductive film" and may be abbreviated as an "NCF."

As a method of laminating such a film-like adhesive on the workpiece or modified workpiece, the most common and simple method is a method in which a thermosensitive adhesive is contained in the film-like adhesive to perform heat lamination, or thermal lamination. This thermal lamination may usually be performed through placing a laminate comprising a sheet for semiconductor wafer processing and a workpiece or modified workpiece on a work table and fusing and bonding the film-like adhesive to the surface of the workpiece or modified workpiece of the laminate while heating the film-like adhesive.

However, due to the effect of heat applied to the workpiece or modified workpiece during the thermal lamination of the film-like adhesive, a base film of the sheet for semiconductor wafer processing (which may be simply referred to as a "base film," hereinafter) attached to the workpiece or modified workpiece may be fused and bonded to a table for work. In the present description, such a phenomenon that the base film is fused and bonded to a table for work due to the heating of the sheet for semiconductor wafer processing is also referred to as "fusion bonding." If the fusion bonding of the base film occurs, the laminate comprising the workpiece or modified workpiece on which the film-like adhesive is laminated will be difficult to separate from the table for work and the workpiece or modified workpiece may be damaged in the worst case.

According to the studies by the present inventors, it has been revealed that the problem as the above is particularly significant when a base film for sheets for semiconductor wafer processing that has recoverability is used for the purpose of reducing the loosening amount after the expanding work, as previously described.

An object of the present invention is to provide a base film for sheets for semiconductor wafer processing that has recoverability and is less likely to cause fusion bonding of the base film when used as a part of a sheet for semiconductor wafer processing even if the sheet for semiconductor wafer processing is heated, such as during thermal lamination of a film-like adhesive. Another object of the present invention is to provide a sheet for semiconductor wafer processing that is obtained using such a base film.

Means for Solving the Problems

To achieve the above objects, the present inventors have conducted studies as below. A base film having recoverability can be realized by using a thermoplastic elastomer that is shrinkable by heating. According to the confirmation by the present inventors, however, heat deformation of the base film in contact with a work table largely affects the fusion bonding of the base film to the work table. That is, one possibility is that, when the sheet for semiconductor wafer processing is heated, such as during the thermal lamination of an NCF, the base film of the sheet for semiconductor wafer processing in contact with a work table deforms to follow the irregularities on the surface of the work table and, as a result, the close contact of the base film with the work table is excessively enhanced to lead to the fusion bonding of the base film. Therefore, when the base film is used as a part of a sheet for semiconductor wafer processing, if the surface of the base film at the side facing the work table is composed of a material that is less likely to deform even under a heated condition, it is possible to avoid the fusion bonding of the base film.

On the basis of the above studies, the present inventors have acquired a novel knowledge that, when a base film for sheets for semiconductor wafer processing has a multilayer structure and a thermoplastic elastomer contained in each layer has a different Vicat softening point, the base film for sheets for semiconductor wafer processing can be thermally shrinkable thereby to have recoverability, but is less likely to readily deform even when heated in a state of being in contact with a work table.

The present invention accomplished on the basis of such knowledge is as follows:

(1) A base film for sheets for semiconductor wafer processing, the base film comprising a resin layer (A) and a resin layer (B) laminated on one surface of the resin layer (A), the base film being characterized in that one surface of the base film for sheets for semiconductor wafer processing comprises a surface of the resin layer (B), the resin layer (A) contains a thermoplastic elastomer having a Vicat softening point of 50° C. or higher and 87° C. or lower, the resin layer (B) contains a thermoplastic elastomer having a Vicat softening point of 91° C. or higher and 220° C. or lower, and a thickness t of the base film for sheets for semiconductor wafer processing and a thickness $t_A$ of the resin layer (A) satisfy Formulae (i) and (ii) below.

$$t \leq 150 \ \mu m \tag{i}$$

$$t_A/t \geq 78\% \tag{ii}$$

(2) The base film for sheets for semiconductor wafer processing as described in the above (1), wherein the resin layer (B) has a thickness $t_B$ of 3 μm or more and 15 μm or less.

(3) The base film for sheets for semiconductor wafer processing as described in the above (1) or (2), further comprising a resin layer (C) laminated on the other surface of the resin layer (A), wherein the resin layer (C) contains a thermoplastic elastomer having a Vicat softening point of 91° C. or higher and 220° C. or lower.

(4) The base film for sheets for semiconductor wafer processing as described in the above (3), wherein the resin layer (C) is composed of the same material as that of the resin layer (B).

(5) The base film for sheets for semiconductor wafer processing as described in the above (3) or (4), wherein the resin layer (C) has a thickness $t_C$ of 3 μm or more and 15 μm or less.

(6) A sheet for semiconductor wafer processing, the sheet comprising the base film for sheets for semiconductor wafer processing as described in any one of the above (1) to (5) and a pressure sensitive adhesive layer laminated on the opposite surface to the surface comprising the resin layer (B) in the base film for sheets for semiconductor wafer processing.

(7) A method of manufacturing semiconductor devices, comprising: a mounting step of attaching a surface at a side of the pressure sensitive adhesive layer of the sheet for semiconductor wafer processing as described in the above (6) to one surface of a semiconductor wafer; a thermal lamination step of placing the sheet for semiconductor wafer processing attached to the semiconductor wafer on a table so that the surface comprising the resin layer (B) in the sheet for semiconductor wafer processing is to be a contact surface and heat-laminating a film for thermosensitive adhesion on a surface of the semiconductor wafer opposite to a surface facing the sheet for semiconductor wafer processing;

an expanding step of extending the sheet for semiconductor wafer processing to divide the semiconductor wafer laminated with the film for thermosensitive adhesion thereby to obtain chips comprising divided bodies of the semiconductor wafer laminated with the film for thermosensitive adhesion; a shrinking step of heating a peripheral region of the sheet for semiconductor wafer processing to shrink the base film for sheets for semiconductor wafer processing located in the peripheral region, the peripheral region being a region located at an outer circumferential side than a region to which the chips are attached; and a picking-up step of separating the chips individually from the sheet for semiconductor wafer processing after the shrinking step thereby to obtain the chips as the semiconductor devices, the method being characterized in that a modified layer-forming step is performed before starting the expanding step, wherein the modified layer-forming step irradiates the semiconductor wafer with laser light of infrared region so that the laser light is focused on a focal spot set inside the semiconductor wafer, thereby to forma modified layer in the semiconductor wafer.

Advantageous Effect of the Invention

According to the present invention, there is provided a base film for sheets for semiconductor wafer processing that has recoverability and is less likely to cause fusion bonding when used as apart of a sheet for semiconductor wafer processing even if the sheet for semiconductor wafer processing is heated. According to the present invention, there is also provided a sheet for semiconductor wafer processing that is obtained using the above base film.

EMBODIMENTS FOR CARRYING OUT THE INVENTION

Figure 1:
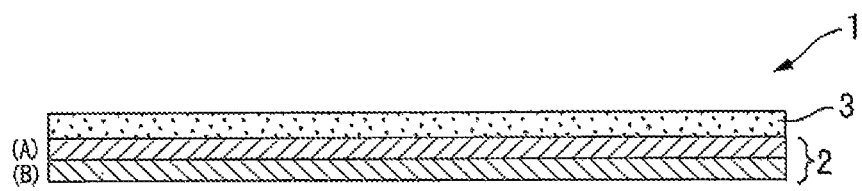
FIG. 1 is a schematic cross-sectional view of a sheet for semiconductor wafer processing according to an embodiment of the present invention.

Hereinafter, embodiments of the present invention will be described.
1. Sheet for Semiconductor Wafer Processing As illustrated in FIG. 1, the sheet for semiconductor wafer processing 1 according to an embodiment of the present invention comprises a base film for sheets for semiconductor wafer processing (base film) 2 and a pressure sensitive adhesive layer 3. A specific applicable example of the sheet for semiconductor wafer processing 1 according to an embodiment of the present invention may be a dicing sheet. The term "dicing sheet" as used in the present description encompasses a dicing/die bonding sheet, those having a film for protecting the rear surface of a semiconductor wafer on the surface of the pressure sensitive adhesive layer 3 opposite to the surface facing the base film 2, and those having another base film and another pressure sensitive adhesive layer to which a ring frame is attached. The term "dicing" as used in the present description encompasses not only blade dicing but also a case of dividing a semiconductor wafer into individual pieces without using a blade, such as stealth dicing (registered trademark). The term "sheet" as used in the present description encompasses the concept of a "tape."

(1) Base Film

The base film 2 of the sheet for semiconductor wafer processing 1 according to the present embodiment has a laminate structure of at least two layers. The base film 2 illustrated in FIG. 1 has a two-layer structure, as the simplest example, comprising a resin layer (A) and a resin layer (B).

Specifically, the base film 2 illustrated in FIG. 1 is a base film for semiconductor wafer processing that comprises a resin layer (A) and a resin layer (B) laminated on one surface of the resin layer (A). The resin layer (A) may be disposed nearer to the pressure sensitive adhesive layer 3 than the resin layer (B). One surface of the sheet for semiconductor wafer processing 1 comprises a surface of the resin layer (B). That is, in the base film 2 of the sheet for semiconductor wafer processing 1, the resin layer (B) is located farthest from the pressure sensitive adhesive layer 3.

The resin layer (A) contains a thermoplastic elastomer of which the Vicat softening point is relatively low while the resin layer (B) contains a thermoplastic elastomer of which the Vicat softening point is relatively high. According to such a difference in the Vicat softening points of the thermoplastic elastomers contained in both resins, the effect of the present invention can be exhibited such that the former of large thermal shrinkability acts to allow the base film to have the recoverability while the latter of small heat deformation acts to avoid the fusion bonding to a work table when the base film is used as a part of a sheet for semiconductor wafer processing and the sheet for semiconductor wafer processing is even heated. The action and effect of the present invention can be obtained at least when the ranges as described below are employed as ranges of the Vicat softening points of respective thermoplastic elastomers which allow for such a difference in the Vicat softening points of the thermoplastic elastomers.

(1-1) Resin Layer (A)

The resin layer (A) contains a thermoplastic elastomer of which the Vicat softening point is 50° C. or higher and 87° C. or lower. In the present description, the Vicat softening point refers to a temperature that is measured in accordance with JIS K6922-2: 2010.

The resin layer (A) contains a thermoplastic elastomer of which the Vicat softening point is 50° C. or higher and 87° C. or lower, and the base film 2 can thereby have the recoverability. In order for the base film 2 to have excellent recoverability, the resin layer (A) may preferably contain a thermoplastic elastomer of which the Vicat softening point is 55° C. or higher and 80° C. or lower and more preferably contain a thermoplastic elastomer of which the Vicat softening point is 60° C. or higher and 75° C. or lower. In the present description, the above thermoplastic elastomer contained in the resin layer (A) to allow the base film 2 to exhibit the recoverability is also referred to as a "thermoplastic elastomer (A)."

Specific type of the thermoplastic elastomer (A) is not limited, provided that the above condition for the Vicat softening point is satisfied. Examples of a material that constitutes the thermoplastic elastomer (A) include olefin-based elastomer, styrene-based elastomer, urethane-based elastomer, and ester-based elastomer. Polyvinyl chloride may also be used. Among them, olefin-based elastomer may be preferred because the environmental load is low and the above-described physical properties can readily be obtained.

Examples of the above olefin-based elastomer include ethylene-vinyl acetate copolymer, ethylene-(meth)acrylic acid copolymer, high-density polyethylene, low-density polyethylene (specific examples may be LDPE, VLDPE, LLDPE, etc.), copolymer of propylene and α-olefin;

α-olefin polymer (polymer which may be any of homopolymer and copolymer obtained by polymerizing α-olefin); ethylene-propylene-based rubber, such as ethylene-propylene rubber (EPM) and ethylene-propylene-diene rubber (EPDM); and chlorosulfonated polyethylene (CSM). The "(meth)acrylic acid" as used in the present description means both acrylic acid and methacrylic acid. The same applies to other similar terms.

The thermoplastic elastomer (A) may be composed of one type of polymer or may also be a mixture of plural types of polymers.

The content of the thermoplastic elastomer (A) in the resin layer (A) is not limited, provided that the resin layer (A) contains the thermoplastic elastomer (A) thereby to realize that the base film 2 can have the recoverability.

The resin layer (A) may contain various additives, such as pigment, flame retardant, plasticizer, antistatic, glidant and filler, in addition to the thermoplastic elastomer (A). Examples of the pigment include titanium dioxide and carbon black. Examples of the filler include organic materials such as melamine resin, inorganic materials such as fumed silica, and metal-based materials such as nickel particles. The content of such additives is not particularly limited, but should be within a range in which the base film 2 has appropriate recoverability and does not lose desirable smoothness and flexibility.

(1-2) Resin Layer (B)

The resin layer (B) contains a thermoplastic elastomer of which the Vicat softening point is 91° C. or higher and 220° C. or lower. The resin layer (B) contains a thermoplastic elastomer of which the Vicat softening point is 91° C. or higher and 220° C. or lower, and it is thereby possible to avoid the phenomenon that the base film 2 is fusion-bonded to a work table or the like when the sheet for semiconductor wafer processing 1 is heated.

In view of more effectively avoiding the fusion bonding of the base film 2, the resin layer (B) may contain a thermoplastic elastomer of which the Vicat softening point is 103° C. or higher. In the present description, the thermoplastic elastomer contained in the resin layer (B) to avoid the fusion bonding of the base film 2 as the above is also referred to as a "thermoplastic elastomer (B)." The Vicat softening point of the thermoplastic elastomer (B) may preferably be 200° C. or lower. In view of readily obtaining high recoverability even when, with regard to a thickness t of the base film 2, thickness $t_B$ of the resin layer (B) and thickness $t_C$ of a resin layer (C) which are to be described later, $(t_B+t_C)/t$ ($t_B/t$ if the base film 2 does not have the resin layer (C)) is large (e.g. 15% or more), the Vicat softening point of the thermoplastic elastomer (B) may also be 108° C. or lower.

Specific type of the thermoplastic elastomer (B) is not limited, provided that the above condition for the Vicat softening point is satisfied. Examples of a material that constitutes the thermoplastic elastomer (B) include olefin-based elastomer, styrene-based elastomer, urethane-based elastomer, and ester-based elastomer. More specific examples include high-density polyethylene (HDPE), polypropylene, polystyrene, and polybutylene terephthalate. In view of easy production of the base film 2 and in view of reducing the possibility that delamination occurs between the resin layer (A) and the resin layer (B), the thermoplastic elastomer (A) and the thermoplastic elastomer (B) may preferably be elastomers of the same type. In view of a low environmental load and in view of easily maintaining flexibility of the base film as a whole and keeping the expanding suitability and performance of picking up chips at certain levels, the thermoplastic elastomer (B) may preferably be olefin-based elastomer.

The thermoplastic elastomer (B) may be composed of one type of polymer or may also be a mixture of plural types of polymers.

The content of the thermoplastic elastomer (B) in the resin layer (B) is not limited, provided that the resin layer (B) contains the thermoplastic elastomer (B) thereby to realize that the fusion bonding of the base film 2 does not readily occur.

The resin layer (B) may contain various additives, such as pigment, flame retardant, plasticizer, antistatic, glidant and filler, in addition to the thermoplastic elastomer (B). Examples of the pigment include titanium dioxide and carbon black. Examples of the filler include organic materials such as melamine resin, inorganic materials such as fumed silica, and metal-based materials such as nickel particles. The content of such additives is not particularly limited, but should be within a range in which the fusion bonding of the base film 2 is actually avoided owing to the resin layer (B) and the base film 2 does not lose desirable smoothness and flexibility.

(1-3) Resin Layer (C)

Figure 2:
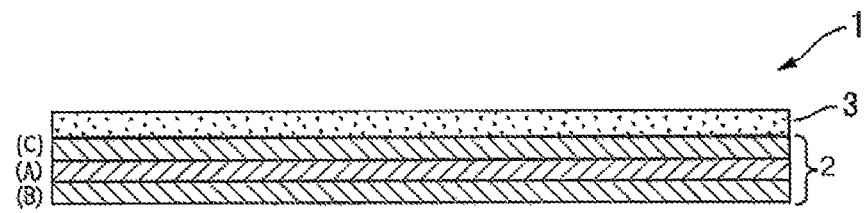
FIG. 2 is a schematic cross-sectional view of a sheet for semiconductor wafer processing according to another example of an embodiment of the present invention.

As illustrated in FIG. 2, the base film 2 according to an embodiment of the present invention may preferably have a resin layer (C) on the surface of the resin layer (A) opposite to the surface facing the resin layer (B).

Like the resin layer (B), the resin layer (C) contains a thermoplastic elastomer of which the Vicat softening point is 91° C. or higher and 220° C. or lower. The resin layer (C) contains a thermoplastic elastomer of which the Vicat softening point is 91° C. or higher and 220° C. or lower (also referred to as a "thermoplastic elastomer (C)," hereinafter), and thereby problems such as curl are less likely to occur in the base film 2 or in the sheet for semiconductor wafer processing 1 when the base film 2 is manufactured or when the sheet for semiconductor wafer processing 1 is used. If curl occurs in the sheet for semiconductor wafer processing 1, the attaching property or wafer supporting property of the sheet will be problematic. In view of more stably suppressing the occurrence of curl in the base film 2 of the sheet for semiconductor wafer processing 1 or in the sheet for semiconductor wafer processing 1, the difference between the Vicat softening point of the thermoplastic elastomer (B) and the Vicat softening point of the thermoplastic elastomer (C) may preferably be 4° C. or less and more preferably 2° C. or less. The resin layer (C) may preferably be composed of a material of the same type as that of the resin layer (B) and may more preferably be composed of the same material as that of the resin layer (B). In view of readily obtaining high recoverability even when, with regard to the thickness t of the base film 2, thickness $t_B$ of the resin layer (B) and thickness $t_C$ of the resin layer (C) which are to be described later, $(t_B+t_C)/t$ is large (e.g. 15% or more), the Vicat softening point of the thermoplastic elastomer (C) may also be 108° C. or lower.

(1-4) Thickness and Surface Roughness

The thickness t (unit: μm) of the base film 2 is 150 μm or less. In general, when the base film of a sheet for semiconductor processing is thick, the heat quantity required for shrinking the base film increases. Therefore, if the base film is unduly thick, it may be difficult for the base film to have appropriate recoverability. Since the thickness of the base film 2 of the sheet for semiconductor processing 1 according to an embodiment of the present invention is 150 μm or less, the base film 2 can be shrunken without excessively heating the base film 2. In view of enhancing the shrinkability of the base film 2 due to heating, the thickness t (unit: μm) of the base film 2 may preferably be 140 μm or less, more preferably 130 μm or less, and particularly preferably 120 μm or less.

The lower limit of the thickness t of the base film 2 may be set appropriately in accordance with the properties required for a sheet for semiconductor processing comprising the base film 2. The thickness t of the base film 2 may ordinarily be 10 μm or more, preferably 20 μm or more, more preferably 30 μm or more, and particularly preferably 50 μm or more.

In the base film 2 according to an embodiment of the present invention, the thickness t of the base film 2 and the thickness $t_A$ of the resin layer (A) satisfy Formula (1) below.

$$t_A/t \geq 78\% \tag{1}$$

The base film 2 satisfies the above Formula (1) with regard to the thicknesses and can thereby have the recoverability. In view of allowing the base film 2 to have excellent recoverability, the thickness t of the base film 2 and the thickness $t_A$ of the resin layer (A) may preferably satisfy Formula (2) below and more preferably satisfy Formula (3) below.

$$t_A/t \geq 80\% \tag{2}$$

$$t_A/t \geq 83\% \tag{3}$$

The upper limit of $t_A/t$ may preferably be 97% or less and further preferably 95% or less. In view of stably obtaining the performance of the base film 2, $t_A/t$ may be less than 85%.

The thickness $t_B$ of the resin layer (B) is not limited. In view of making it easy to allow the base film 2 to have recoverability and to avoid the fusion bonding of the base film 2, the thickness $t_B$ of the resin layer (B) may preferably be 3 μm or more and 15 μm or less and more preferably 5 μm or more and 12 μm or less.

The thickness $t_C$ of the resin layer (C) is not limited. In view of making it easy to prevent the occurrence of curl in the base film 2, the thickness $t_C$ of the resin layer (C) may preferably be 3 μm or more and 15 μm or less, like the thickness $t_B$ of the resin layer (B).

In the base film 2 according to an embodiment of the present invention, the thickness t of the base film 2, thickness $t_B$ of the resin layer (B) and thickness $t_C$ of the resin layer (C) may preferably satisfy Formula (4) below.

$$3\% < (t_B + t_C)/t < 22\% \tag{4}$$

In view of stably obtaining the performance of the base film 2, $(t_B + t_C)/t$ may also be 15% or more. When the base film 2 does not have the resin layer (C), $t_B/t$ is substituted for $(t_B + t_C)/t$.

In the base film 2 of the sheet for semiconductor wafer processing 1 according to an embodiment of the present invention, the surface of the base film 2 opposite to the surface at the side facing the pressure sensitive adhesive layer 3 (the former and latter surfaces will also be referred to as a "base film back surface" and "pressure sensitive adhesive processed surface," respectively, in the present description) may preferably have an arithmetic average roughness Ra of 1.0 μm or less as defined by JIS B0601: 2013 (ISO 4287: 1997) (unless otherwise stated, the term "arithmetic average roughness Ra" will be used in this sense, hereinafter). Owing to the arithmetic average roughness Ra of the base film back surface being 1.0 μm or less, when laser is incident to the base film back surface of the sheet for semiconductor wafer processing 1, the incident laser light may readily and efficiently arrive at the semiconductor wafer to which the sheet for semiconductor wafer processing 1 is attached. In view of enhancing the above efficient arrival of the incident laser light, the arithmetic average roughness Ra of the base film back surface may more preferably be 0.5 μm or less and further preferably 0.3 μm or less. When the arithmetic average roughness Ra of the base film back surface is within a range of such low values, the fusion bonding of the base film to a work table may readily occur. In the sheet for semiconductor processing 1 according to an embodiment of the present invention, however, the fusion bonding of the base film can be suppressed because the resin layer (B) contains a thermoplastic elastomer having a Vicat softening point within the predetermined range. The arithmetic average roughness Ra of the pressure sensitive adhesive processed surface may not profoundly affect the efficient arrival of laser light as the arithmetic average roughness Ra of the base film back surface does, but may preferably be about 3.0 μm or less. As for both the pressure sensitive adhesive processed surface and the base film back surface, the lower limit of the arithmetic average roughness Ra is not limited from the view point of efficient arrival of the incident laser light. In view of maintaining the production stability and the like, the arithmetic average roughness Ra of these surfaces may preferably be 0.01 μm or more.

(1-5) Other Structures of Base Film

Between adjacent two layers of the above resin layer (A) and resin layer (B) which constitute the base film 2 and the resin layer (C) which is provided as necessary (when these layers are collectively specified, these layers will be referred to as "the resin layer (A) and the like," hereinafter), another layer than the resin layer (A) and the like may be provided separately as an interlayer. The outermost layer of the base film 2 may be composed of another layer than the resin layer (A) and the like. For example, when a layer of similar material is disposed between the resin layer (A) and the resin layer (B), the interfacial adhesion between the layers can be enhanced and the productivity of the base film 2 can be improved. In an alternative embodiment, a layer having antistatic property may be provided for the purpose of giving antistatic property to the base film 2 and/or a layer of good interfacial adhesion may be provided at the adjacent surface to the pressure sensitive adhesive layer 3 in order to enhance the interfacial adhesion between the base film 2 and the pressure sensitive adhesive layer 3. When the base film 2 comprises another layer than the resin layer (A) and the like as the above, such a layer may preferably be composed of a material that constitutes the resin layer (A) and the like so that the functions based on the resin layer (A) and the like are not inhibited. The base film 2 may be subjected to surface treatment. When the base film 2 is subjected to surface treatment, an additional effect may be obtained, such as enhancement of the interfacial adhesion to the pressure sensitive adhesive layer 3. The type of surface treatment may be appropriately set in accordance with objects. Specific examples of the surface treatment include corona treatment, plasma treatment, and primer treatment.

(1-6) Method of Manufacturing Base Film

Method of manufacturing the base film 2 is not particularly limited. Examples thereof include melt extrusion method such as T-die method, round-die method and inflation method; calender method; and solution method such as dry method and wet method, and any method may be employed. In view of manufacturing the base film 2 at high productivity, it may be preferred to employ the melt extrusion method or the calender method. When, among them, the melt extrusion method is employed for manufacturing, the base film having a laminate structure may be manufactured by coextrusion molding using a resin composition for forming the resin layer (A) and a resin composition for forming the resin layer (B) and if necessary further using a resin composition for forming the resin layer (C). The base film 2 obtained may be subjected to surface treatment such as the previously-described corona treatment as necessary.

(2) Other Constitutional Elements of Sheet for Semiconductor Wafer Processing

Examples of other constitutional elements than the base film 2 in the sheet for semiconductor wafer processing 1 include a pressure sensitive adhesive layer 3 disposed on one surface of the base film 2 and a release sheet for protecting the surface of the pressure sensitive adhesive layer 3 opposite to the side facing the base film 2, that is, the surface for being attached to a workpiece or modified workpiece.

(2-1) Pressure Sensitive Adhesive Layer 3

Pressure sensitive adhesive that constitutes the pressure sensitive adhesive layer 3 is not particularly limited. For example, rubber-based, acrylic-based, silicone-based and polyvinyl ether-based pressure sensitive adhesives or the like may be used. Energy ray curable-type (including ultraviolet curable-type), heat foamable-type and heat curable-type pressure sensitive adhesives may also be used. Pressure sensitive adhesive as described, for example, in JP2011-139042A can be used as the pressure sensitive adhesive. When the sheet for semiconductor processing 1 according to an embodiment of the present invention is used as a dicing/die-bonding sheet, appropriate adhesives may be used, such as pressure sensitive adhesive, thermoplastic adhesive and B-stage adhesive, which have both the wafer fixing function and the die adhesion function.

The thickness of the pressure sensitive adhesive layer 3 may ordinarily be 3 µm to 60 µm and preferably about 5 µm to 50 µm. When the thickness falls within such a range, it may be easy to suppress the heat quantity which is required to increase the temperature of the base film 2.

(2-2) Release Sheet

The release sheet for protecting the pressure sensitive adhesive layer 3 may be freely selected.

Examples of the release sheet to be used include a polyethylene film, polypropylene film, polybutene film, polybutadiene film, polymethylpentene film, polyvinyl chloride film, vinyl chloride copolymer film, polyethylene terephthalate film, polyethylene naphthalate film, polybutylene terephthalate film, polyurethane film, ethylene-vinyl acetate film, ionomer resin film, ethylene-(meth)acrylic acid copolymer film, ethylene-(meth)acrylic ester copolymer film, polystyrene film, polycarbonate film, polyimide film, and fluorine resin film. Crosslinked films thereof may also be used. Laminate film obtained by laminating a plurality of such films may also be used.

It may be preferred that the release surface (in particular, the surface to be in contact with the pressure sensitive adhesive layer 3) of the above release sheet is subjected to release treatment. Examples of release agent to be used for the release treatment include alkyd-based, silicone-based, fluorine-based, unsaturated polyester-based, polyolefin-based, and wax-based release agents.

The thickness of the release sheet is not particularly limited and may ordinarily be about 20 µm to 150 µm.

(3) Haze

In the sheet for semiconductor wafer processing 1 according to an embodiment of the present invention, the haze as defined in JIS K7136: 2000 (ISO 14782: 1999) may preferably be 0.01% or more and 15% or less when light for measurement is incident on the surface nearer to the base film than the pressure sensitive adhesive layer. The haze being 15% or less allows the incident laser light to be effectively utilized when the laser light is incident on the sheet for semiconductor wafer processing 1. In view of more stably realizing the effective utilization of laser light incident on the sheet for semiconductor wafer processing 1, the above haze may more preferably be 10% or less. The lower limit of the above haze may not be set from the viewpoint of the effective utilization of laser light incident on the sheet for semiconductor wafer processing 1. In view of enhancing the production stability and the like, the above haze may preferably be about 0.01% or more.

2. Method of Manufacturing Sheet for Semiconductor Wafer Processing

Method of manufacturing the sheet for semiconductor wafer processing 1 comprising the above base film 2 and pressure sensitive adhesive layer 3 is not particularly limited.

Some exemplary methods of manufacturing the sheet for semiconductor wafer processing 1 may be as follows.

(i) The pressure sensitive adhesive layer 3 is formed on the release sheet and the base film 2 is laminated on the pressure sensitive adhesive layer 3 by applying pressure. In this operation, the method of forming the pressure sensitive adhesive layer 3 may be freely selected.

One exemplary method of forming the pressure sensitive adhesive layer 3 may be as follows. A coating agent is prepared which contains a pressure sensitive adhesive composition for forming the pressure sensitive adhesive layer 3 and if necessary further contains some solvent. The main surface, among surfaces of the base film 2, which is located nearer to the resin layer (A) than the resin layer (B), is coated with the coating agent using a coater, such as a roll coater, knife coater, knife-over-roll coater, air knife coater, die coater, bar coater, gravure coater and curtain coater. The layer of the coating agent on the base film 2 is dried thereby to form the pressure sensitive adhesive layer 3.

(ii) The base film 2 is formed and the pressure sensitive adhesive layer 3 is formed thereon and, if necessary, a release sheet is further laminated thereon. In this operation, the method of forming the pressure sensitive adhesive layer 3 may be freely selected as the above.

In an exemplary method other than the above methods of (i) and (ii), a pressure sensitive adhesive layer 3 separately formed in a sheet-like form may be attached to the base film 2.

3. Method of Manufacturing Semiconductor Devices

Description will then be directed to an example of the method of manufacturing semiconductor devices using the sheet for semiconductor wafer processing 1 according to an embodiment of the present invention.

(1) Mounting Step

First, amounting step is performed to attach the surface at the side of the pressure sensitive adhesive layer 3 of the sheet for semiconductor wafer processing 1 according to an embodiment of the present invention to one surface of a semiconductor wafer. The method of manufacturing semiconductor devices using the sheet for semiconductor wafer processing 1 according to an embodiment of the present invention is suitable when semiconductor devices are manufactured from a semiconductor wafer having electrodes on its surface, such as for flip-chip bonding and TSV. A so-called attaching apparatus may be used to carry out the mounting step. During the mounting step, a ring frame may be attached to a region at the outer circumferential side of the region to which the semiconductor wafer is attached, within the surface at the side of the pressure sensitive adhesive layer 3 of the sheet for semiconductor wafer processing 1. In the plan view, a region at which the pressure sensitive adhesive layer 3 is exposed may exist as a peripheral region between the ring frame and the semiconductor wafer.

(2) Thermal Lamination Step

In the thermal lamination step, first, the sheet for semiconductor wafer processing 1 is placed on a table so that the surface comprising the resin layer (B) in the sheet for semiconductor wafer processing 1 is to be the contact surface. Next, a film-like adhesive having thermosensitive property is heat-laminated (thermally laminated) on the surface opposite to the surface facing the sheet for semiconductor wafer processing 1, of the semiconductor wafer to which the surface of the pressure sensitive adhesive layer 3 of the sheet for semiconductor wafer processing 1 is attached. When the semiconductor wafer has electrodes on its surface, the electrodes may ordinarily be present on the surface of the semiconductor wafer opposite to the surface facing the sheet for semiconductor wafer processing 1.

Specific type of the film-like adhesive is not limited, provided that the film-like adhesive has appropriate thermosensitive property. Specific examples include a film-like member formed of an adhesive composition that contains a heat-resistant resin material, such as polyimide resin, epoxy resin and phenol resin, and a hardening accelerator.

Conditions for laminating the film-like adhesive on the semiconductor wafer are not limited. An appropriate condition may be set with consideration for the material which constitutes the film-like adhesive, the thickness of the film-like adhesive, the degree of heat resistance of the sheet for semiconductor wafer processing 1, and the like. The film-like adhesive may be anisotropically-conductive one or may also be a nonconductive NCF. When electrodes are present on the surface of the semiconductor wafer opposite to the surface facing the sheet for semiconductor wafer processing 1, the film-like adhesive deforms to follow the profiles of electrodes due to the thermal lamination, and the smoothness of the surface of the film-like adhesive opposite to the surface facing the semiconductor wafer may tend to be maintained. The attaching of the film-like adhesive may be performed under reduced pressure in order to facilitate the deformation of the film-like adhesive following the profiles of electrodes. Due to this heat lamination, the sheet for semiconductor wafer processing 1 may ordinarily undergo heating, for several tens of seconds to several minutes, which causes the sheet to be heated to a temperature within a range of about 60° C. to about 100° C. The base film of the sheet for semiconductor wafer processing undergoes such heating thereby to be softened. When the base film of the sheet for semiconductor wafer processing has recoverability, this tendency may be significant.

However, the base film 2 of the sheet for semiconductor wafer processing 1 according to an embodiment of the present invention has a laminate structure, as previously described. Therefore, among the layers which constitute the base film 2, the resin layer (B) containing the thermoplastic elastomer (B) of which the Vicat softening point is relatively high comes into contact with a table. Since the fusion bonding to a table may not readily occur even when the resin layer (B) is heated, the sheet for semiconductor wafer processing 1 according to an embodiment of the present invention is less likely to cause fusion bonding of the base film 2 during the thermal lamination step.

(3) Expanding Step

In the expanding step, the sheet for semiconductor wafer processing 1 is extended thereby to divide the semiconductor wafer laminated with the film-like adhesive. This operation results in a state in which chips obtained by dividing the semiconductor wafer are attached onto the pressure sensitive adhesive layer 3 of the sheet for semiconductor wafer processing 1. Specific conditions for the expanding step are not limited. For example, the temperature when extending the sheet for semiconductor wafer processing 1 may be an ordinary temperature or may also be a low temperature (specific example may be about 0° C.). This expanding step may ordinarily cause loosening within the peripheral region (region between the ring frame and the set of chips in a plan view) of the sheet for semiconductor wafer processing 1.

(4) Modified Layer-Forming Step

Before the above expanding step is started, a modified layer-forming step is performed. The modified layer-forming step irradiates the semiconductor wafer with laser light of infrared region so that the laser light is focused on a focal spot set inside the semiconductor wafer, thereby to form modified layers in the semiconductor wafer. In an embodiment, after the modified layer-forming step is performed for the semiconductor wafer, the mounting step may be performed. In an alternative embodiment, the modified layer-forming step may be performed for the semiconductor wafer in a state of being laminated on the sheet for semiconductor processing 1 after the mounting step. In another embodiment, the modified layer-forming step may be performed for the semiconductor wafer laminated with the film-like adhesive on one surface after the thermal lamination step. When the modified layer-forming step is carried out after the thermal lamination step, the semiconductor wafer is irradiated with the laser light of infrared region through the sheet for semiconductor processing 1.

(5) Shrinking Step

In the shrinking step, the peripheral region of the sheet for semiconductor processing 1 is heated. Here, in the sheet for semiconductor wafer processing 1 attached thereto with the chips which are obtained by the above expanding step and comprise divided bodies of the semiconductor wafer laminated with the film-like adhesive, the peripheral region can be defined as a region located at the outer circumferential side than a region to which the chips are attached. The peripheral region of the sheet for semiconductor processing 1 is heated thereby to shrink the base film 2 located within the peripheral region and it is possible to reduce the loosening amount, which is caused in the expanding step, of the sheet for semiconductor wafer processing 1. Heating method in the shrinking step is not limited. Examples of the heating method include blowing hot air to the peripheral region, irradiating the peripheral region with infrared rays, and irradiating the peripheral region with microwaves.

(6) Picking-Up Step

After the sheet for semiconductor wafer processing is recovered by the shrinking step as the above, a picking-up step is performed. The picking-up step separates the chips, which are attached to the sheet for semiconductor wafer processing 1, individually from the sheet for semiconductor wafer processing 1, thereby to obtain the chips as semiconductor devices.

By carrying out the manufacturing method as the above, semiconductor devices can be manufactured using the sheet for semiconductor wafer processing 1 according to an embodiment of the present invention.

The embodiments heretofore explained are described to facilitate understanding of the present invention and are not described to limit the present invention. Therefore, it is intended that the elements disclosed in the above embodiments include all design changes and equivalents to fall within the technical scope of the present invention.

For example, the sheet for semiconductor wafer processing 1 according to an embodiment of the present invention can be used for the following use application other than for a dicing sheet. A semiconductor wafer before grinding is subjected to the same step as the above-described modified layer-forming step on another pressure sensitive adhesive sheet and thereafter impact is given to the semiconductor wafer concurrently with grinding the semiconductor wafer to divide it into chips. The obtained chips are transferred to the sheet for semiconductor wafer processing 1 according to an embodiment of the present invention, followed by the above-described expanding step, shrinking step and picking-up step.

In the above-described method of manufacturing semiconductor devices, the thermal lamination step is mentioned as a step that involves heating, but the sheet for semiconductor wafer processing 1 according to an embodiment of the present invention may be used, for example, for a method of manufacturing semiconductor devices which includes a step of performing a heating test.

EXAMPLES

Hereinafter, the present invention will be described more specifically with examples, etc., but the scope of the present invention is not limited to these examples, etc.

Example 1

(1) Production of Base Film

Ethylene-vinyl acetate copolymer ("Ultrathene 540" available from Tosoh Corporation, Vicat softening point: 72° C., tensile elastic modulus at 23° C.: 80 MPa, referred to as a "thermoplastic elastomer (A1)," hereinafter), one type of thermoplastic elastomer, was prepared as a material for forming the resin layer (A).

Polypropylene ("EXCELLEN EP3711E1" available from Sumitomo Chemical Company, Limited, Vicat softening point: 114° C., tensile elastic modulus at 23° C.: 400 MPa, referred to as a "thermoplastic elastomer (B1)," hereinafter), one type of thermoplastic elastomer, was prepared as a material for forming the resin layer (B).

The material for forming the resin layer (A) and the material for forming the resin layer (B) were subjected to coextrusion molding using a compact T-die extruder ("Labo-plastomill" available from Toyo Seiki Seisaku-sho, LTD) to obtain a base film having a two-layer structure of the resin layer (A) and the resin layer (B) and also having a total thickness and layer thickness ratio as listed in Table 1. The arithmetic average roughness Ra of the exposed surface of the resin layer (B), corresponding to the base film back surface in the present example, was 0.09 μm.

(2) Preparation of Pressure Sensitive Adhesive Composition

Butyl acrylate/methyl methacrylate/2-hydroxyethyl acrylate (mass ratio: 62/10/28) was reacted to obtain a pressure sensitive acrylic polymer, which was then reacted with methacryloyloxyethyl isocyanate (MOI) of an amount of 30 g per 100 g of the pressure sensitive acrylic polymer (corresponding to 0.8 equivalent of 2-hydroxyethyl acrylate) to obtain an energy ray curable-type pressure sensitive polymer. A pressure sensitive adhesive composition was obtained by mixing in a solvent 100 mass parts of the obtained energy ray curable-type pressure sensitive polymer, 3 mass parts of Irgacure 184 (available from BASF) as a photopolymerization initiator, and 4.3 mass parts of CORONATE L (available from NIPPON POLYURETHANE INDUSTRY CO., LTD.) as a crosslinker.

(3) Production of Sheet for Semiconductor Processing

The release surface of a release film ("SP-PET3811" available from LINTEC Corporation) was coated with the above pressure sensitive adhesive composition and drying of the pressure sensitive adhesive composition by heating was then performed to obtain a laminate of the coated film of the pressure sensitive adhesive composition and the release film. The thickness of the coated film to be a pressure sensitive adhesive layer afterward was 20 μm. The surface of the laminate at the side of the coated film and the surface of the above base film at the side of the resin layer (A) were attached to each other thereby to obtain a sheet for semiconductor wafer processing.

Example 2

A sheet for semiconductor wafer processing was obtained in the same manner as in Example 1 except that ethylene-methacrylic acid copolymer ("NUCREL N0903HC" available from DUPONT-MITSUI POLYCHEMICALS CO., LTD., Vicat softening point: 82° C., tensile elastic modulus at 23° C.: 140 MPa, referred to as a "thermoplastic elastomer (A2)," hereinafter), one type of thermoplastic elastomer, was used as a material for forming the resin layer (A).

Example 3

A material of the thermoplastic elastomer (B1) for forming a resin layer (B), a material of the thermoplastic elastomer (A1) for forming a resin layer (A), and a material of the thermoplastic elastomer (B1) for forming a resin layer (B) were subjected to coextrusion molding using a compact T-die extruder ("Labo-plastomill" available from Toyo Seiki Seisaku-sho, LTD) to obtain a base film having a three-layer structure of the resin layer (B), the resin layer (A) and the resin layer (B) and also having a total thickness and layer thickness ratio as listed in Table 1. The arithmetic average roughness Ra of the exposed one surface of the resin layer (B), corresponding to the base film back surface in the present example, was 0.09 μm. The present example corresponds to a case in which the base film 2 has a resin layer (C) and the material and thickness of the resin layer (C) are the same as those of the resin layer (B). This applies to Examples 4 to 6 and Comparative Example 3 below.

The release surface of a release film ("SP-PET3811" available from LINTEC Corporation) was coated with the pressure sensitive adhesive composition produced in Example 1 and drying of the pressure sensitive adhesive composition by heating was then performed to obtain a laminate of the coated film of the pressure sensitive adhesive composition and the release film. The thickness of the coated film to be a pressure sensitive adhesive layer afterward was 20 μm. The surface of the laminate at the side of the coated film and the opposite surface of the above base film to the surface of which the arithmetic average roughness Ra was measured (the opposite surface was the surface of the resin layer (B)) were attached to each other thereby to obtain a sheet for semiconductor wafer processing.

Example 4

A sheet for semiconductor wafer processing was obtained in the same manner as in Example 3 except that the material for forming the resin layer (B) was high-density polyethylene ("Novatec HD HJ360" available from Japan Polyethylene Corporation, Vicat softening point: 122° C., tensile elastic modulus at 23° C.: 800 MPa, referred to as a "thermoplastic elastomer (B2)," hereinafter), one type of thermoplastic elastomer, and the total thickness was 80 μm.

Example 5

A sheet for semiconductor wafer processing was obtained in the same manner as in Example 3 except that the layer thickness ratio in the three-layer structure of the resin layer (B), resin layer (A) and resin layer (B) was as listed in Table 1.

Example 6

A sheet for semiconductor wafer processing was obtained in the same manner as in Example 5 except that the material for forming the resin layer (B) was low-density polyethylene ("Novatec LD LC525" available from Japan Polyethylene Corporation, Vicat softening point: 96° C., tensile elastic modulus at 23° C.: 150 MPa, referred to as a "thermoplastic elastomer (B3)," hereinafter), one type of thermoplastic elastomer.

Comparative Example 1

A sheet for semiconductor wafer processing was obtained in the same manner as in Example 1 except that a material of the thermoplastic elastomer (A1) for forming the resin layer (A) was used and the base film was composed of the resin layer (A) as a single layer.

Comparative Example 2

A sheet for semiconductor wafer processing was obtained in the same manner as in Example 1 except that a material of the thermoplastic elastomer (B1) for forming the resin layer (B) was used and the base film was composed of the resin layer (B) as a single layer.

Comparative Example 3

A sheet for semiconductor wafer processing was obtained in the same manner as in Example 3 except that the layer thickness ratio in the three-layer structure of the resin layer (B), resin layer (A) and resin layer (B) was as listed in Table 1.

Comparative Example 4

A sheet for semiconductor wafer processing was obtained in the same manner as in Example 1 except that the total thickness of the base film and the layer thickness ratio in the two-layer structure of the resin layer (A) and resin layer (B) were as listed in Table 1.

«Exemplary Test 1» <Evaluation of Thermal Lamination Resistance>

The sheet for semiconductor wafer processing obtained in each of the examples and comparative examples was attached to an 8-inch size silicon wafer of a thickness of 50 μm and a ring frame using an attaching apparatus ("RAD-2700 F/12" available from LINTEC Corporation).

Attaching operation was conducted under the condition of a heating temperature of 90° C., atmospheric pressure of 0.1 MPa and attaching time of 90 seconds using a vacuum laminator ("RAD3810" available from LINTEC Corporation) but without using a film-like adhesive. After the attaching, the sheet for semiconductor wafer processing was released from the table and visual confirmation was made as to whether the transport of the sheet for semiconductor wafer processing was possible or not. The thermal lamination resistance was evaluated in accordance with the criteria below:

"A": transport from the table was possible without fusion bonding between the base film and the table (very good);

"B": a slight degree of fusion bonding occurred between the base film of the sheet for semiconductor wafer processing and the table, and the tape was withdrawn by the table when transported, but was able to be released from the table and transported (good); and "C": the base film of the sheet for semiconductor wafer processing was fusion-bonded to the table and was not able to be transported, and apparatus error occurred (bad).

«Exemplary Test 2» <Evaluation of Recoverability>

The sheet for semiconductor wafer processing obtained in each of the examples and comparative examples was attached to an 8-inch size silicon wafer of a thickness of 50 μm and a ring frame in the same manner as in Exemplary Test 1. A laser irradiation apparatus ("DFL7360" available from DISCO Corporation, laser wavelength: 1,064 nm) was used to form modified layers inside the silicon wafer on the sheet for semiconductor wafer processing by irradiating the silicon wafer with laser to be focused inside the silicon wafer while scanning the laser along planned cutting lines that were set so as to form chips of 8 mm×8 mm. The laser irradiation was performed from the surface of the semiconductor wafer at the side to which the sheet for semiconductor wafer processing was not attached.

The sheet for semiconductor wafer processing formed with the modified layers was extended in the surface direction by a pulling-up amount of 12 mm at a pulling-up rate of 1 mm/s using a die separator ("DDS2300" available from DISCO Corporation) to divide the silicon wafer on the sheet for semiconductor wafer processing. After releasing the expansion, the peripheral region of the sheet for semiconductor wafer processing was heated from the pressure sensitive adhesive layer side by hot air at a drier output temperature of 220° C. and a rotating speed of 5 mm/°, and visual confirmation was made as to whether the loosening caused after the release of expansion was recovered by the thermal shrinkage. The recoverability was evaluated in accordance with the criteria below:

"A": loosening was recovered (very good);

"B": loosening was not completely recovered, but the transport and storage steps were able to be carried out without any contact with an apparatus and instrument during these steps (good); and "C": loosening was not recovered and the transport or storage step was not possible (bad).

TABLE 1

| | Base film | | Thickness of pressure sensitive adhesive layer | Thermal lamination resistance | Heat shrinkability |
|---|---|---|---|---|---|
| | Total thickness | Layer thickness ratio | | | |
| Example 1 | 100 μm | A1:B1 = 8:1 | 20 μm | A | A |
| Example 2 | 100 μm | A2:B1 = 8:1 | 20 μm | A | A |
| Example 3 | 100 μm | B1:A1:B1 = 1:16:1 | 20 μm | A | A |
| Example 4 | 80 μm | B2:A1:B2 = 1:16:1 | 20 μm | A | A |
| Example 5 | 100 μm | B1:A1:B1 = 1:8:1 | 20 μm | A | B |
| Example 6 | 100 μm | B3:A1:B3 = 1:8:1 | 20 μm | B | A |
| Comparative Example 1 | 100 μm | A1 Single layer | 20 μm | C | A |
| Comparative Example 2 | 100 μm | B1 Single layer | 20 μm | A | C |
| Comparative Example 3 | 100 μm | B1:A1:B1 = 1:6:1 | 20 μm | A | C |
| Comparative Example 4 | 170 μm | A1:B1 = 14:3 | 20 μm | A | C |

As found from Table 1, the sheets for semiconductor wafer processing which satisfy the conditions of the present invention are excellent in both the evaluations of the thermal lamination resistance and recoverability.

INDUSTRIAL APPLICABILITY

The sheet for semiconductor wafer processing according to the present invention can be suitably used as a sheet for semiconductor wafer processing, such as a dicing sheet for semiconductor wafer laminated with a film-like adhesive, for which steps including heating is performed at the time of use.

DESCRIPTION OF REFERENCE NUMERALS

1 . . . Sheet for semiconductor wafer processing
2 . . . Base film (Base film for sheets for semiconductor wafer processing)
  (A) . . . Resin layer (A)
  (B) . . . Resin layer (B)
  (C) . . . Resin layer (C)
3 . . . Pressure sensitive adhesive layer

The invention claimed is:

1. A base film for sheets for semiconductor wafer processing, the base film comprising a resin layer (A), a resin layer (B) laminated on one surface of the resin layer (A), and a resin layer (C) laminated on the other surface of the resin layer (A), wherein
one surface of the base film for sheets for semiconductor wafer processing comprises a surface of the resin layer (B),
the resin layer (A) contains a thermoplastic elastomer having a Vicat softening point of 50° C. or higher and 87° C. or lower,
the resin layer (B) contains a thermoplastic elastomer having a Vicat softening point of 91° C. or higher and 220° C. or lower,
the resin layer (C) contains a thermoplastic elastomer having a Vicat softening point of 91° C. or higher and 220° C. or lower, and
a thickness t of the base film for sheets for semiconductor wafer processing and a thickness $t_A$ of the resin layer (A) satisfy Formulae (1) and (2) below:

$$t \leq 150 \text{ μm} \tag{1}$$

$$t_A/t \geq 78\% \tag{2}$$

2. The base film for sheets for semiconductor wafer processing as recited in claim 1, wherein the resin layer (B) has a thickness $t_B$ of 3 μm or more and 15 μm or less.

3. The base film for sheets for semiconductor wafer processing as recited in claim 1, wherein the resin layer (C) is composed of same material as that of the resin layer (B).

4. The base film for sheets for semiconductor wafer processing as recited in claim 1, wherein the resin layer (C) has a thickness $t_C$ of 3 μm or more and 15 μm or less.

5. The base film for sheets for semiconductor wafer processing as recited in claim 1, wherein the one surface comprising the resin layer (B) in the base film for sheets for semiconductor wafer processing has an arithmetic average roughness Ra of 1.0 μm or less.

6. A sheet for semiconductor wafer processing, the sheet comprising the base film for sheets for semiconductor wafer processing as recited in claim 1 and a pressure sensitive adhesive layer laminated on an opposite surface to the one surface comprising the resin layer (B) in the base film for sheets for semiconductor wafer processing.

7. A method of manufacturing semiconductor devices by using a sheet for semiconductor wafer processing,
wherein the sheet for semiconductor wafer processing comprises a base film comprising a resin layer (A), a resin layer (B) laminated on one surface of the resin layer (A), and a pressure sensitive adhesive layer,
one surface of the base film for sheets for semiconductor wafer processing comprises a surface of the resin layer (B),
the resin layer (A) contains a thermoplastic elastomer having a Vicat softening point of 50° C. or higher and 87° C. or lower,
the resin layer (B) contains a thermoplastic elastomer having a Vicat softening point of 91° C. or higher and 220° C. or lower, and
a thickness t of the base film for sheets for semiconductor wafer processing and a thickness $t_A$ of the resin layer (A) satisfy Formulae (1) and (2) below:

$$t \leq 150 \text{ μm} \tag{1}$$

$$t_A/t \geq 78\% \tag{2), and}$$

wherein the pressure sensitive adhesive layer is laminated on an opposite surface to the one surface comprising the resin layer (B) in the base film for sheet for semiconductor wafer processing, the method comprising:
- a mounting step of attaching a surface at the side of the pressure sensitive adhesive layer of the sheet for semiconductor wafer processing to one surface of a semiconductor wafer;
- a thermal lamination step of placing the sheet for semiconductor wafer processing attached to the semiconductor wafer on a table so that the one surface comprising the resin layer (B) in the sheet for semiconductor wafer processing is to be a contact surface and heat-laminating a film for thermosensitive adhesion on the surface of the semiconductor wafer opposite to the surface facing the sheet for semiconductor wafer processing;
- an expanding step of extending the sheet for semiconductor wafer processing to divide the semiconductor wafer laminated with the film for thermosensitive adhesion thereby to obtain chips comprising divided bodies of the semiconductor wafer laminated with the film for thermosensitive adhesion;
- a shrinking step of heating a peripheral region of the sheet for semiconductor wafer processing to shrink the base film for sheets for semiconductor wafer processing located in the peripheral region, the peripheral region being a region located at an outer circumferential side than a region to which the chips are attached; and
- a picking-up step of separating the chips individually from the sheet for semiconductor wafer processing after the shrinking step thereby to obtain the chips as the semiconductor devices,
- wherein a modified layer-forming step is performed before starting the expanding step, wherein the modified layer-forming step irradiates the semiconductor wafer with laser light of infrared region so that the laser light is focused on a focal spot set inside the semiconductor wafer, thereby to form a modified layer in the semiconductor wafer.

8. The method of manufacturing semiconductor devices as recited in claim 7, the base film further comprising a resin layer (C) laminated on another surface of the resin layer (A), wherein the resin layer (C) contains a thermoplastic elastomer having a Vicat softening point of 91° C. or higher and 220° C. or lower.

9. The method of manufacturing semiconductor devices as recited in claim 8, wherein the resin layer (C) is composed of same material as that of the resin layer (B).

10. The method of manufacturing semiconductor devices as recited in claim 8, wherein the resin layer (C) has a thickness $t_C$ of 3 μm or more and 15 μm or less.

11. The method of manufacturing semiconductor devices as recited in claim 7, wherein the one surface comprising the resin layer (B) in the base film for sheets for semiconductor wafer processing has an arithmetic average roughness Ra of 1.0 μm or less.

* * * * *